(12) United States Patent
Kihara et al.

(10) Patent No.: US 7,759,823 B2
(45) Date of Patent: Jul. 20, 2010

(54) SWITCHING DEVICE

(75) Inventors: Hideyuki Kihara, Kanagawa (JP);
Katsumi Nagumo, Kanagawa (JP)

(73) Assignee: Panasonic Corporation, Osaka (JP)

( * ) Notice: Subject to any disclaimer, the term of this patent is extended or adjusted under 35 U.S.C. 154(b) by 376 days.

(21) Appl. No.: 11/889,219

(22) Filed: Aug. 9, 2007

(65) Prior Publication Data

US 2008/0048500 A1    Feb. 28, 2008

(30) Foreign Application Priority Data

Aug. 11, 2006   (JP)   ............... P. 2006-220001

(51) Int. Cl.
*H02J 3/04* (2006.01)
(52) U.S. Cl. ...................................... 307/70
(58) Field of Classification Search ............... 307/112, 307/70, 143, 82
See application file for complete search history.

(56) References Cited

U.S. PATENT DOCUMENTS 5,157,291 A * 10/1992 Shimoda ............... 327/408
7,227,277 B2 * 6/2007 Chapman et al. .......... 307/43
7,256,568 B2 * 8/2007 Lam et al. ................. 323/222
7,498,694 B2 * 3/2009 Luo et al. .................. 307/82

FOREIGN PATENT DOCUMENTS

| JP | 6-290593 | 10/1994 |
|---|---|---|
| JP | 2000-124780 | 4/2000 |
| JP | 3148454 | 1/2001 |

* cited by examiner

*Primary Examiner*—Albert W Paladini
(74) *Attorney, Agent, or Firm*—McDermott Will & Emery LLP

(57) ABSTRACT

To provide a switching device capable of a switch-controlling a voltage source regardless of voltage changes in the voltage source to be switched and the voltage source employed for switch control.

A switching path 61 includes, between the input terminal 1 and output terminal 4 for a voltage source, a series connection of the source or drain electrodes of PMOS transistors 10a and 10b connected to their back-gate electrode. A driving circuit has an NMOS transistor 11a having a load resistor 12a at its drain electrode and NMOS transistor 11b having a load resistor 12b at its drain electrode, which are connected to the gate electrodes of the PMOS transistors, respectively and receives the output from the logic inverter 14 for the switching control.

18 Claims, 14 Drawing Sheets

FIG. 6

SWITCHING DEVICE

BACKGROUND OF THE INVENTION

1. Field of the Invention

This invention relates to a switching device for select-switching the connection between a voltage source and a power-supplied device.

2. Description of the Related Art

As a conventional means for selectively switching an any source from a plurality of voltage sources in an individual semiconductor device or integrated circuit, where one of two kinds of input voltages having different magnitudes is selected as an output voltage, there is a previously known supplied voltage switching circuit in which even if the voltage applied to a first input terminal becomes lower than the voltage applied to a second input terminal, an overcurrent is prevented from passing through a transistor internally provided (for example, see Patent Reference 1).

Further, like PROM, where a plurality of power sources having different voltage levels in operation are used by switching inside a semiconductor device, there is a known power source switching circuit which is difficult to form a current path and can switch the power source with no voltage drop (see Patent Reference 2).

Patent Reference 1: JP-A-2000-124780
Patent Reference 2: Japanese Patent No. 3148454

The problems to be solved for the above prior arts will be explained below. In the prior arts, a P-channel MOS or an N-channel MOS transistor is referred to as PMOS or NMOS transistor, respectively. For the gate-source voltage in them, the source electrode is located at a reference voltage, and for the other voltage values, the grounding terminal is located at the reference voltage=0 V.

First, FIG. 12 explains an embodiment of the above Patent Reference 1. This embodiment presented a problem that unless a voltage source voltage VDDsel of a switching control logic inverter is kept so as to be not lower than a voltage source voltage VDD1 or VDD2, the voltage source on the interrupted side becomes conductive.

Specifically, assuming that with respect to two enhancement type PMOS transistors Tr11 and Tr12, their voltage source input terminal 1 side or 2 side serves as a source electrode and their voltage source output terminal 4 side serves as a drain electrode; and further the source voltage of Tr11 is Vs11, the gate voltage thereof is Vg11, the source voltage of Tr12 is Vs12 and the gate voltage thereof is Vg12, for the voltage source input terminal 1 or 2, in order to place either one of the P-channels of these transistors in an interrupted state, the following condition is required.

$$(Vg11-Vs11) > \text{(gate-source threshold voltage of } Tr11) \quad (1)$$

$$(Vg12-Vs12) > \text{(gate-source threshold voltage of } Tr12) \quad (2)$$

Since the above source voltage Vs11 or Vs12 is equal to the voltage source voltage VDD1 or VDD2, respectively, by substitution, the following condition is required.

$$(Vg11-VDD1) > \text{(gate-source threshold voltage of } Tr11) \quad (3)$$

$$(Vg12-VDD2) > \text{(gate-source threshold voltage of } Tr12) \quad (4)$$

Now, where the output of the switching control logic inverter for controlling the above transistors ideally changes from a grounding voltage to the voltage source voltage VDDsel of the switching control logic inverter, since the gate voltages Vg11 and Vg12 are equal to this voltage source voltage VDDsel, by substitution, the following condition is required.

$$(VDDsel-VDD1) > \text{(gate-source threshold voltage of } Tr11) \quad (5)$$

$$(VDDsel-VDD2) > \text{(gate-source threshold voltage of } Tr12) \quad (6)$$

Accordingly, for a general gate-source threshold voltage= $(-0.3 \text{ to } -0.7)$ V or so, in order to set the interrupting condition for the above transistors, i.e. gate-source voltage=0 V, the following condition is required.

$$(VDDsel-VDD1) \geq 0 \text{ V} \quad (7)$$

$$(VDDsel-VDD2) \geq 0 \text{ V} \quad (8)$$

Thus, it was absolutely necessary that in FIG. 12, the voltage source voltage VDDsel of the switching control logic inverter is kept to be not lower than both voltage source voltages VDD1 and VDD2.

This can be attained if the voltage source voltages VDD1 and VDD2 are known, otherwise the voltage source voltage to be interrupted and the above voltage source voltage VDDsel are correlated with each other so as to satisfy the above Equation (7) or (8). However, switch control could not be done between the above voltages VDD1 and VDD2.

Secondly, FIG. 13 shows an example of FIG. 2 in an embodiment of the above Patent Reference 2. This embodiment presents a problem that if the difference between two voltage source voltages exceeds the forward diode voltage of a parasitic diode that is necessarily generated at the interface between the P-channel electrode and N-well of each of enhancement type PMOS transistors T1 and T3, the voltage source on the interrupted side becomes conductive.

Now, it is assumed that a voltage source voltage VB is selected as a voltage source output voltage VX. For simplicity, as shown in FIG. 13, if level changing circuits 12a, 12b in FIG. 2 in the embodiment of the Patent Reference 2 are replaced by equivalent switches 51, 52 for the switched outputs thereof, respectively, the output voltages switched by the equivalent switches 51, 52 are a grounding voltage for the equivalent switch 51 and a voltage source voltage VB for the equivalent switch 52.

Thus, the above transistor T3 and a depression type NMOS transistor T4 become conductive, whereas the above transistor T1 and a depression type NMOS transistor T2 are interrupted.

As explained in the problem that the invention described in the specification of the above Patent Reference 2 is to solve, because of the insufficient interrupting performance of the transistor T2 on the interrupted side, the voltage source output voltage VX (=VB) is reflected on the drain voltage of the transistor T1 through the N-channel of the transistor T2.

Now, as a condition for interrupting the transistor T1, assuming that its source voltage is Vs1, its drain voltage is Vd1 and the forward diode voltage of a parasitic diode Di1 existing between its source electrode and N-well is Vf1, in order that the parasitic diode Di1 is maintained in its reverse-biased state, the following condition is required.

$$(Vs1-Vd1) < Vf1 \quad (9)$$

Further, the source Vs1 is equal to the voltage source voltage VA and the drain voltage Vd1 is equal to the voltage source output voltage VX (=VB) through the transistors T3 and T4 on the conductive side and the transistor T2 on the incompletely interrupted side. Therefore, by substitution, the following condition is required.

$$(VA-VB) < Vf1 \quad (10)$$

Namely, if the voltage source voltage VA on the interrupted state is the voltage source output voltage VB by the forward diode voltage Vf1 of the parasitic diode Di1, it was impossible to keep the interrupted state of the voltage source input terminal 1.

The above inconvenience equally occurs also when in FIG. 13, the voltage source input terminal 1 is on the conductive side and the voltage source input terminal 2 is on the interrupted state. For this reason, assuming that the forward diode voltage of a parasitic diode Di3 is Vf3, resultantly, in the relationship between the voltage source voltages VA and VB, the above inconvenience is attributable to the following fact that switching control could not be done under the following condition:

when the voltage source input terminal 1 is switch-selected, $$(VA-VB) \geq Vf1 \qquad (11)$$

when the voltage source input terminal 2 is switch-selected, $$(VB-VA) \geq Vf3 \qquad (12)$$

SUMMARY OF THE INVENTION

This invention has been accomplished in view of the above circumstance. An object of this invention is to provide a switching device capable of switch-controlling a voltage source regardless of voltage changes in the voltage sources to be switched and another voltage source for switch control.

The switching device according to this invention, firstly, employs enhancement type PMOS transistors (first means) as a means for effectively selecting conduction or interruption between a voltage source and its power-supplied device.

Secondly, in order that while one of the parasitic diodes inevitably generated in the PMOS transistors is forward-biased, the other thereof is reverse-biased, the above two PMOS transistors are connected in series with each other so that the voltage source is switch-connected (second means). In this configuration, regardless of voltage changes in the voltage source to be switch-selected, the voltage source can be switch-controlled.

Thirdly, assuming that a power source voltage is given from each of the voltage sources, between the PMOS transistor and its switch-controlling circuit, a driver circuit using a threshold voltage independent from the voltage of each of voltage sources with respect to a reference voltage common to the switching control circuit is formed of an enhancement NMOS transistor. In this configuration, the voltage source can be switch-controlled regardless of voltage changes in a plurality of voltage sources to be switch-selected and another voltage source for switch-driving them.

The switching device provided by this invention is a switching device for selectively switching the connection between any one of a plurality of voltage sources and a power-supplied device, each of switching paths for connecting each of the plurality of voltage sources and the power-supplied device comprises an input terminal connected to any one of the voltage sources, a common output terminal connected to the power-supplied device, and a first and a second enhancement type P-channel MOS transistor, wherein the drain electrode of the first enhancement type P-channel MOS transistor and the source electrode of the second enhancement type P-channel MOS transistor is connected to each other, the gate electrode of the first enhancement type P-channel MOS transistor is connected to the output terminal; and the gate electrode of the second enhancement type P-channel MOS transistor is connected to the input terminal.

In accordance with the above configuration, since two enhancement type P-channel MOS transistors are connected in series so that when one of parasitic diodes generated in these transistors is forward-biased, the other thereof is reverse-biased, even if a voltage difference among a plurality of voltage sources becomes not smaller than a forward diode voltage of the forward-biased parasitic diode, the voltage source on the interrupted side will not become conductive. Further, in accordance with the above configuration, since the gate electrode of each transistor is placed at the potential equal to that at the terminal on the side of the power-supplied device or voltage source, the voltage from the voltage source for switch control connected to the gate electrode of each transistor can be level-shifted. Thus, even if the voltage from the voltage source for switch control is lower than the voltage from the voltage source to be switched, the voltage source on the interrupted side will not become conductive. Accordingly, in accordance with the above configuration, the voltage source can be switch-controlled regardless of voltage changes in the voltage sources to be switched and another voltage source for switch control.

Further, in the above switching device provided by this invention, the output terminal is connected to the gate electrode of the first enhancement type P-channel MOS transistor via a first resistor; and the input terminal is connected to the gate electrode of the second enhancement type P-channel MOS transistor via s second resistor.

In the above switching device provided by this invention, the output terminal is connected to the gate electrode of the first enhancement type P-channel MOS transistor via a first level shift circuit, and the input terminals is connected to the gate electrode of the second enhancement type P-channel MOS transistor via a second level shift circuit.

In the above switching device provided by this invention, a switching control input terminal is connected to the gate electrode of the first enhancement type P-channel MOS transistor and the gate electrode of the first enhancement type P-channel MOS transistor respectively via a first N MOS transistor and a second N MOS transistor.

In the above switching device provided by this invention, a back gate electrode of the first enhancement type P-channel MOS transistor and the source electrode thereof are connected; and a back gate electrode of the second enhancement type P-channel MOS transistor and the drain electrode thereof are connected.

In the above switching device provided by this invention, a back gate electrode of the first enhancement type P-channel MOS transistor and the drain electrode thereof are connected; and a back gate electrode of the second enhancement type P-channel MOS transistor and the source electrode thereof are connected.

In the above switching device provided by this invention, in case of exchanging the connection switching between the plurality of voltage sources and the input terminal, a delay time is provided in a logic input rising.

The switching device provided by this invention is a switching device for selectively switching the connection between any one of a plurality of voltage sources and a power-supplied device, each of switching paths for connecting each of the plurality of voltage sources and the power-supplied device comprises an input terminal connected to any one of the voltage sources, a common output terminal connected to the power-supplied device, and a first and a second enhancement type P-channel MOS transistor, wherein the source electrode of the first enhancement type P-channel MOS transistor and the drain electrode of the second enhancement type P-channel MOS transistor is connected to each other, the gate electrode of the first enhancement type P-channel MOS transistor is connected to the output terminal; and the gate electrode of the second enhancement type P-channel MOS transistor is connected to the input terminal.

In the above switching device provided by this invention, the output terminal is connected to the gate electrode of the first enhancement type P-channel MOS transistor via a first resistor; and the input terminal is connected to the gate electrode of the second enhancement type P-channel MOS transistor via s second resistor.

In the above switching device provided by this invention, the output terminal is connected to the gate electrode of the first enhancement type P-channel MOS transistor via a first level shift circuit, and the input terminals is connected to the gate electrode of the second enhancement type P-channel MOS transistor via a second level shift circuit.

In the above switching device provided by this invention, a switching control input terminal is connected to the gate electrode of the first enhancement type P-channel MOS transistor and the gate electrode of the first enhancement type P-channel MOS transistor respectively via a first N MOS transistor and a second N MOS transistor.

In the above switching device provided by this invention, a back gate electrode of the first enhancement type P-channel MOS transistor and the source electrode thereof are connected; and a back gate electrode of the second enhancement type P-channel MOS transistor and the drain electrode thereof are connected.

In the above switching device provided by this invention, a back gate electrode of the first enhancement type P-channel MOS transistor and the drain electrode thereof are connected; and a back gate electrode of the second enhancement type P-channel MOS transistor and the source electrode thereof are connected.

In the above switching device provided by this invention, in case of exchanging the connection switching between the plurality of voltage sources and the input terminal, a delay time is provided in a logic input rising.

In accordance with the switching device of this invention, firstly, a battery which generates a voltage change during its use can be employed as a voltage source.

Secondly, where there are a plurality of signal input/output processing devices which are used exclusively from one another and require different voltage source voltages, and they are replaced by another processing device in which the common functions of the input/output processing devices are unified with the terminals thereof, one of voltage sources for another processing device can be switch-selected by the switching device according to this invention. In this way, the mounting scale of the input/output processing devices which individually required different voltage sources can be reduced.

BRIEF DESCRIPTION OF THE DRAWINGS

FIG. 6 is a table showing the condition of a voltage difference in the voltage sources in FIGS. 4 and 5 and the operating state of an equivalent switch 1a, 1b, 2a, 2b of the corresponding PMOS transistor.

DESCRIPTION OF THE PREFERRED EMBODIMENTS

Figure 1A:
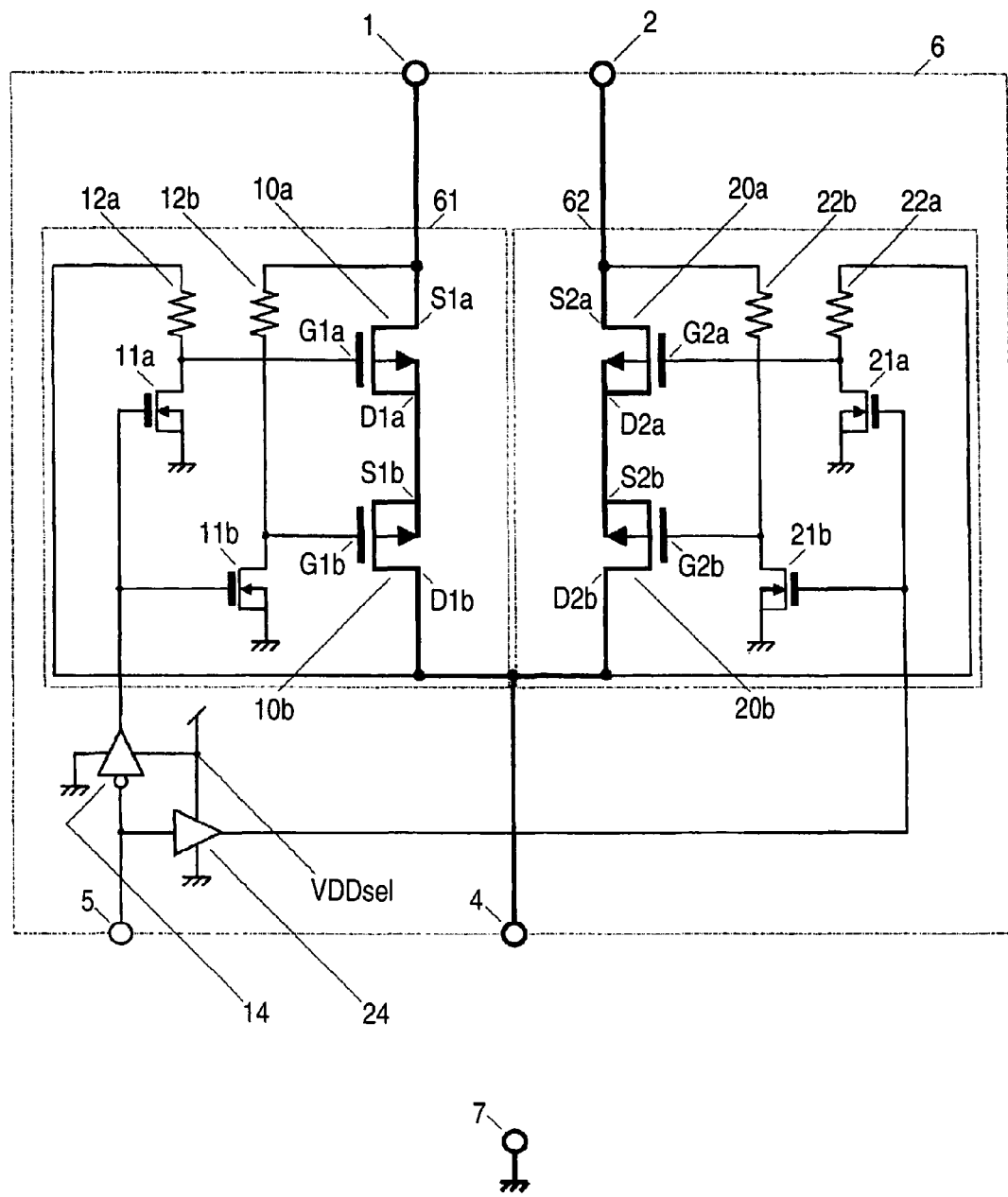
FIG. 1a is a voltage source switching device (driven by NMOS transistors) according to Embodiment I of this invention.

Now referring to the drawings, a detailed explanation will be given of voltage source switching devices according to various embodiments of this invention. In the explanation of Embodiments I, II, III and IV of this invention, the enhancement type P-channel MOS or N-channel MOS are referred to as PMOS or NMOS. Of the voltage variables starting from a large English character V, for gate-source voltages of these transistors or equivalent switches, the source electrode is located at a reference voltage, and for the other voltage values, the grounding terminal 7 in each figure is located at the reference voltage=0 V.

Embodiment I

FIG. 1a shows an embodiment I that includes the first to third means for solving the problems. In FIG. 1a, a voltage source switching device 6 includes voltage source input terminals 1 and 2 for connection to voltage sources, an voltage source output terminal 4 for connection to a power-supplied device for the voltage sources, a voltage source switching path 61 between the input terminal 1 and output terminal 4, a voltage switching path 62 between the input terminal 2 and output terminal 4, and a switch-controlling circuit composed of a logic inverter 14 and a logic inverter 24 having a switch-controlling input terminal 5 for switch-selecting either one of these input terminal 1 or 2 to the output terminal 4.

The above switching path 61 includes, between the input terminal 1 and the output terminal 4 for the corresponding voltage source, a series connection of a source electrode or a drain electrode of PMOS transistors 10a and 10b (first and second PMOS transistors), and a driving circuit which has an NMOS transistor 11a having a load resistor 12a at its drain electrode and NMOS transistor 11b having a load resistor 12b at its drain electrode, which are connected to the gate electrodes of these PMOS transistors, respectively and receives the output from the logic inverter 14 for the switching control.

Likewise, the above switching path 62 includes, between the input terminal 2 and the output terminal 4 for the corresponding voltage source, a series connection of P-channels of PMOS transistors 20a and 20b, and a driving circuit which includes an NMOS transistor 21a having a load resistor 22a at its drain electrode and NMOS transistor 21b having a load resistor 22b at its drain electrode, which are connected to the gate electrodes of these PMOS transistors, respectively and receives the output from the logic inverter 24 for the switching control.

Incidentally, although FIG. 1a illustrates an example in which the PMOS transistors 10a, 10b, 20a, 20b are driven by the NMOS transistors 11a, 11b, 21a, 21b, as long as the PMOS transistors 10a, 10b, 20a, 20b are driven using the voltage from the voltage source, the manner of driving is not limited to the driving by the NMOS transistors 11a, 11b, 21a, 21b.

Figure 1B:
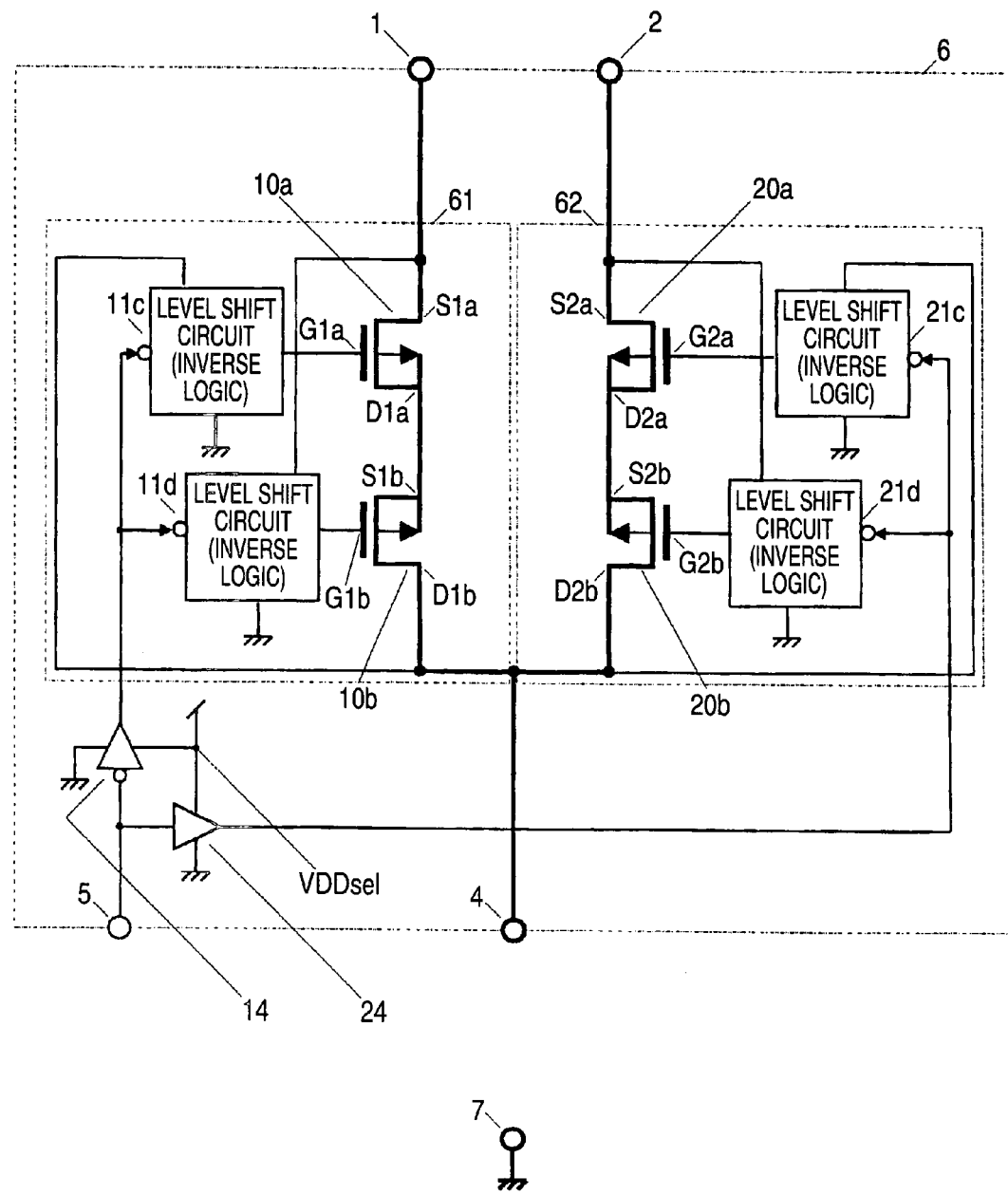
FIG. 1b is a voltage source switching device (driven by level shift circuits) according to Embodiment I of this invention.

FIG. 1b shows the voltage source switching device 6 which operates in the same manner as that in FIG. 1a. In FIG. 1b, the NMOS transistor 11a and load resistor 12a are replaced by a level shift circuit 11c with a reverse logic, the NMOS transistor 11b and load resistor 12b are replaced by a level shift circuit 11d with a reverse logic, the NMOS transistor 21a and load resistor 22a are replaced by a level shift circuit 21c with a reverse logic, and the NMOS transistor 21b and load resistor 22b are replaced by a level shift circuit 21d with a reverse logic.

The logic inverters 14 and 24 switch-control the voltage source so that if the voltage corresponding to logic L is given to the switching control input terminal 5, the input terminal 1 is connected to the output terminal 4, whereas the voltage corresponding to logic H is given to the switching control input terminal 5, the input terminal 2 is connected to the output terminal 4.

In FIG. 1a, the source or drain electrodes of the PMOS transistors 10a, 10b, 20a, 20b are referred to as the source electrode and drain electrode in order in the direction from the voltage source input terminal 1 or 2 to the voltage source output terminal 4.

The gist of carrying out the means for solving the problem of this invention resides in the following two points. Firstly, in order to carry out the above second means, a back gate electrode (N-well electrode) for each of the PMOS transistors is connected to the direct connecting point between the source electrode of the second PMOS transistor and the drain electrode of the first PMOS transistor.

Specifically, the parasitic diodes that are inevitably generated in the PMOS transistors are given anode electrodes on the source electrode side at the input terminal 1 or 2 and drain electrode side at the output terminal 4. The cathode electrodes of these two parasitic diodes are opposed to each other. Thus, for any voltage change between the anode electrodes, a path of interrupting the voltage source can be obtained which is not affected by the passing-through current due to the forward-biased state of these parasitic diodes.

In addition, the other end of the load resistor 12a, 12b, 22a, 22b of the NMOS transistor which is not at the connecting point with the drain electrode of the NMOS transistor is connected to the voltage source of the input terminal 1 or 2 which is different from the voltage source for the PMOS transistor having the gate electrode connected to the connecting point between the load electrode and the drain electrode of the NMOS transistor.

Namely, in the series connection of the PMOS transistors in the interrupted state of the voltage source, by a voltage difference between the conducted side and interrupted side of the voltage sources, a voltage source voltage on the high voltage side is applied to the gate electrode of the PMOS transistor on the side which is not parasitically affected by the parasitic diode reversed biased of the opposed parasitic diodes. Thus, the gate-source voltage≧0 V of the pertinent diode is kept, thereby providing a good interrupted state.

Accordingly, as shown in FIG. 1a, the connecting destinations of the load resistors are made in "a tucked-up connection" that the load resistors 12a and 22a are connected to the voltage source 4 and the load resistors 12b, 22b are connected to the voltage source input terminal 1 or 2.

Secondly, in order to carry out the above third means, the voltage source for the NMOS transistors 11a, 11b, 21a, 21b is supplied by the voltage source to be switch-selected and the source electrodes of these NMOS transistors are used commonly to the grounding electrodes of the inverter 14 and buffer 24. The gate-sources of these NMOS transistors are voltage-driven by the inverter and buffer. Thus, the voltage source therefor is switch-selected regardless of the voltage source voltage to be switch-selected. In short, as seen from FIG. 1a, the voltage source voltage VDDsel for switch control is set separately from the applied voltage of the voltage source input terminal 1 or 2.

The detail of the above operation will be explained referring to FIG. 3 in which the transistors in FIG. 1a are replaced by equivalent switches. As a first step, the process of replacing FIG. 1a by an equivalent circuit shown in FIG. 3. First, the combinations of the NMOS transistor 11a and load resistor 12a in FIG. 1a; NMOS transistor 11b and load resistor 12b; NMOS transistor 21a and load resistor 22a; and NMOS transistor 21b and load resistor 22b are replaced by equivalent switches 13a, 13b, 23a and 23b in FIG. 3, respectively.

The PMOS transistors 10a, 10b, 20a, 20b in FIG. 1a, which are formed in an oxide film insulating structure for their source and drain electrode, generally have am extremely large gate input resistance of several hundreds of MΩ.

Now, even where the consumed current in the load resistors 12a, 12b, 22a, 22b is restricted to several tens of µA in order to realize high efficiency of the power source using rate of the above voltage source switching device 6, assuming that the voltage source voltage is several hundreds of V or less, from the view point of actual design, the upper limit of these load resistors is several MΩ or so which is lower by two orders of magnitude than the above gate input resistance and so can be estimated to be negligible as compared with the gate input resistance. Thus, for simplification, the combinations of the NMOS transistor and the load resistor can be replaced by the equivalent switches 13a, 13b, 23a, 23b in FIG. 3, respectively.

Figure 3:
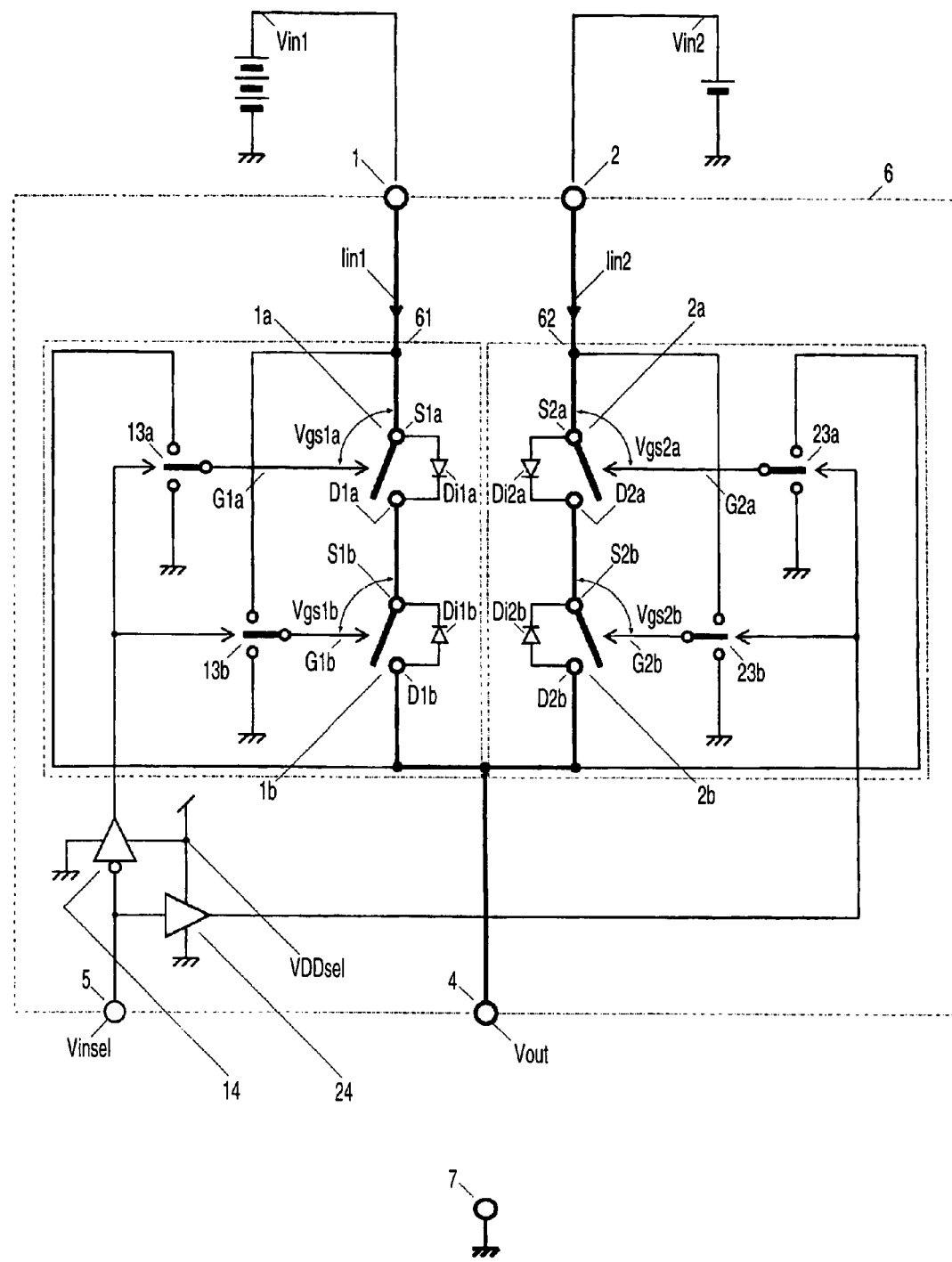
FIG. 3 is a view showing an equivalent circuit of FIG. 1 on which the equivalent circuit shown in FIG. 2c is reflected.

Secondly, parasitic diodes Di1a, Di1b, Di2a, Di2b added in parallel to the PMOS transistors 10a, 10b, 20a, 20b in FIG. 1a are replaced by equivalent switches 1a, 1b, 2a, 2b in FIG. 3, respectively.

Figure 2:
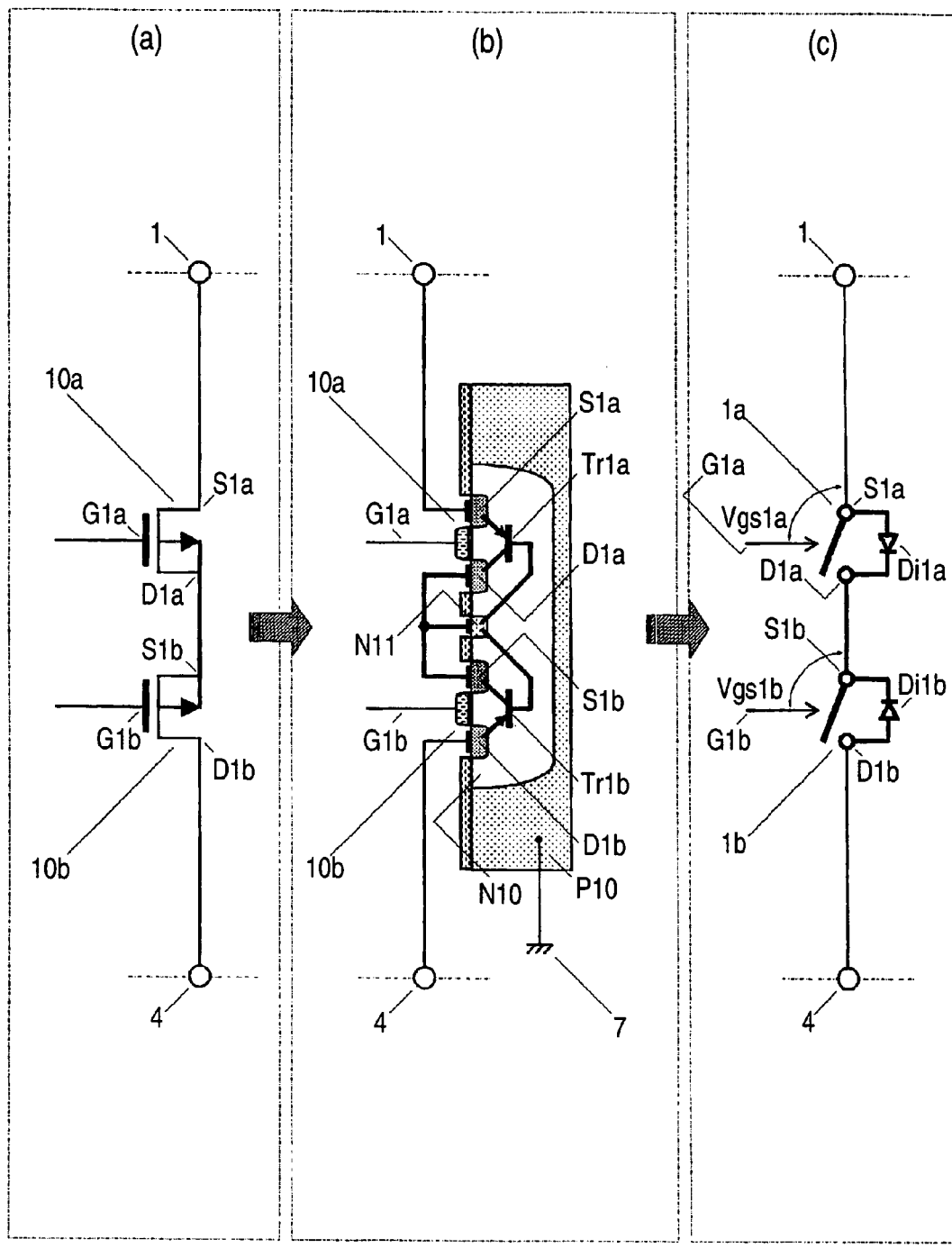
FIG. 2 is a view for explaining a portion of the series connection of PMOS transistors according to Embodiment I of this invention.

FIG. 2 is a view for explaining the portion of the series connection of the PMOS transistors. The extracted part of the PMOS transistors 10a and 10b in FIG. 1a is shown in FIG. 2(a). The sectional structure of semiconductor diffusion in FIG. 2(a) is shown in FIG. 2(b). The PMOS transistors 10a and 10b in FIG. 2(a), because of the diffusion structure in FIG. 2b, generally inevitably generate parasitic PNP transistors Tr1a and Tr1b, respectively.

Now, if the drain electrode D1a of the PMOS transistor 10a, the source electrode S1b of the PMOS transistor 10b and a back gate electrode (N+ well electrode) N11 are directly connected, as seen from FIG. 2(b), in the above transistors Tr1a and Tr1b with their collector and base short-circuited, the parasitic diodes between their emitter and base are left.

Thus, for simplification, assuming that the parasitic diodes left in the parasitic PNP transistors Tr1a and Tr1b in FIG. 2(b) are a parasitic diode Di1a between the source electrode S1a and drain electrode D1a and a parasitic diode Di1b between the source electrode S1b and drain electrode D1b, the PMOS transistors can be replaced by equivalent switches 1a and 1b in FIG. 3 provided in parallel as seen from FIG. 2(c).

Figure 4:
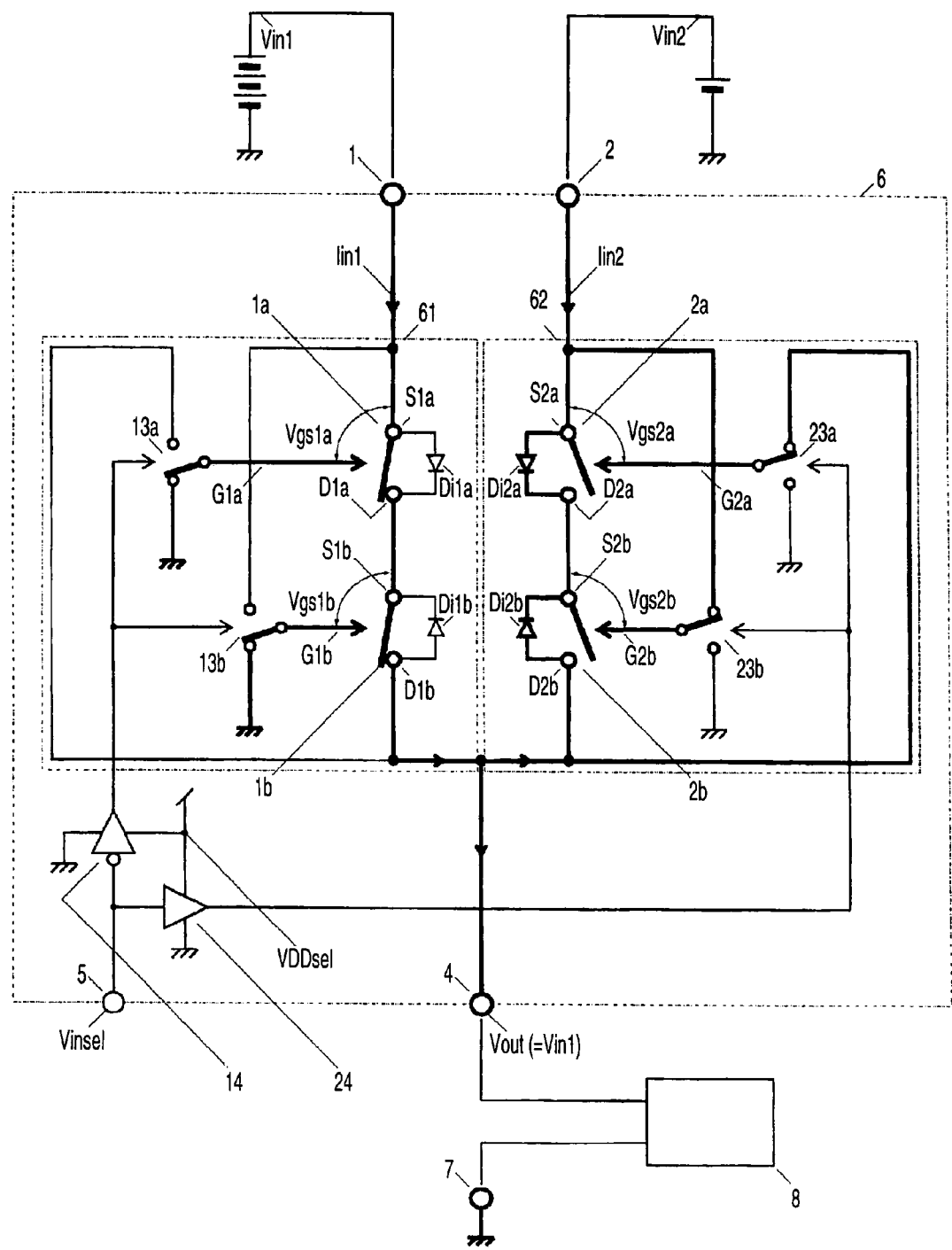
FIG. 4 is a view showing an equivalent circuit of FIG. 1 in which a voltage source input terminal 1 and output terminal 4 are switch-connected in Embodiment I of this invention.
Figure 5:
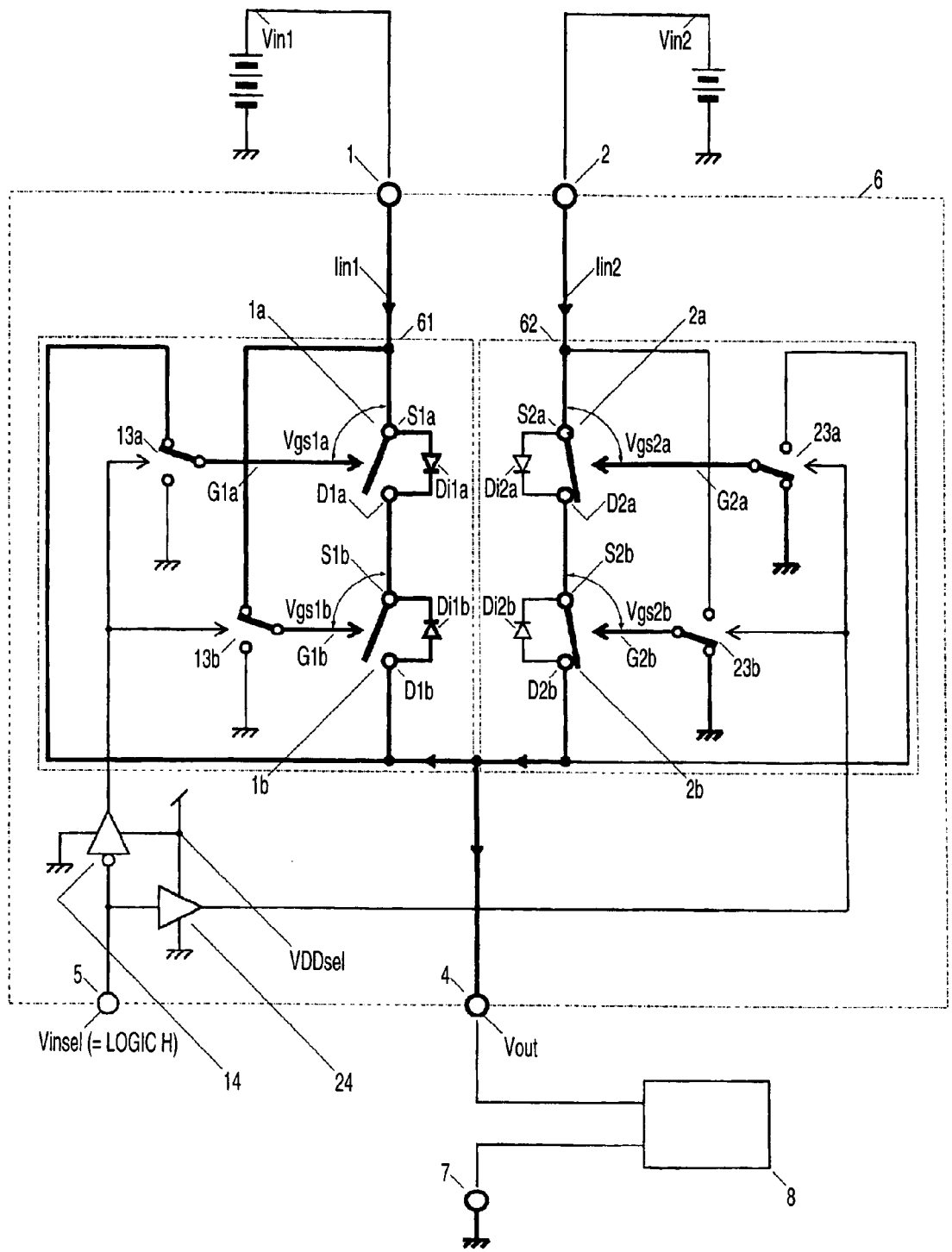
FIG. 5 is a view showing an equivalent circuit of FIG. 1 in which a voltage source input terminal 2 and output terminal 4 are switch-connected in Embodiment I of this invention.

Since addition of the parasitic diodes can be likewise applied to the PMOS transistors 20a and 20b in FIG. 1a, as an equivalent circuit representing the conductive or interrupted state of the above PMOS and NMOS transistors, FIG. 1a is replaced by FIG. 3. On the basis of FIG. 3, the state of the voltage corresponding to the switching control input voltage Vinsel for the switching control input terminal 5=logic L is shown in FIG. 4. The state of the voltage corresponding to the same switching control input voltage Vinsel=logic H is shown in FIG. 5.

In the first place, an explanation will be given of the state of FIG. 4 which is a condition of the input voltage Vinsel=logic L. Under this condition, both the P-channels of the equivalent switches 1a and 1b of the PMOS transistors, i.e. the paths between the source electrode S1a and drain electrode D1a and between the source electrode S1b and drain electrode D1b are conductive. On the other hand, both the P-channels of the equivalent switches 2a and 2b of the PMOS transistors, i.e. the paths between the source electrode S2a and drain electrode D2a and between the source electrode S2b and drain electrode D2b are interrupted.

Thus, conduction is given between the voltage source input terminal 1 and the output terminal 4 whereas interruption is given between the voltage source input terminal 2 and the output terminal 4. A voltage source voltage Vin1 connected to the input terminal 1 is selected so that the voltage source output voltage Vout at the voltage source output terminal 4=Vin1.

The gate-source voltages Vgs1a and Vgs1b of the equivalent switches 1a and 1b, assuming that their P-channel conduction resistance is negligible, become (−Vin1). If the voltage Vin1 is not smaller than the gate-source threshold voltage of each the equivalent switches 1a and 1b, the voltage source switching path 61 falls in a good conductive state.

Since the voltage source voltage Vin1 passing through the equivalent switches 1a and 1b on the conducted side is applied to the gate electrode G2a of the equivalent switch 2a, the gate-source voltage Vgs2a thereof, Vgs2a=(Vin1−Vin2).

Further, since the gate-source oxide film insulating resistance of the equivalent switch 2b is much larger than the forward-biased resistance of the parasitic diode Di2a of the equivalent switch 2a, when the diode Di2a is forward-biased, the gate-source voltage Vgs2b of the equivalent switch 2b is estimated as Vgs2b≧0 V.

Attention is paid to the gate-source voltage of each the equivalent switches 2a and 2b. If the voltage difference between the voltage sources in FIG. 4 is Vin1>Vin2, the diode Di2b is forward-biased to pass, whereas the diode Di2a is reversed-biased and insulated to give no parasitic influence. In addition, the gate-source voltage Vgs2a>0 V holds so that a good interrupted state is provided in the equivalent switch 2a.

Generally, in the MOS transistor, in order to make constant and stabilize the gate-source threshold voltage, the N-well layer is connected to the source electrode so that the back-gate voltage is fixed to the source voltage.

However, the back-gate voltage of the PMOS transistor 20a which is a model of the equivalent switch 2a is fixed to the potential at the drain electrode D2a as seen from FIG. 1a so that the gate-source threshold voltage is not constant with respect to the source electrode S2a. However, if the diode Di2b is forward-biased to pass, the back-gate voltage of the transistor 20a becomes higher than its source voltage. Thus, owing to the back-gate biasing effect, the gate-source threshold voltage of the transistor 20a is made large. Accordingly, even if the gate-source threshold voltage of the equivalent switch 2a varies, because the gate-source voltage Vgs2a≧0 V, the above interrupted state will not be impaired.

On the other hand, if the voltage difference in FIG. 4 is Vin1<Vin2, the diode Di2a is forward-biased to pass, whereas the diode Di2b is reversed-biased and insulated to give no parasitic influence. In addition, when the parasitic diode Di2a is forward-biased, the gate-source voltage Vgs2b≧0 V holds so that the good interrupted state is provided in the equivalent switch 2b. Since the back-gate voltage of the PMOS transistor 20b which is a model of the equivalent switch 2b is fixed to the potential at the source electrode S2b as seen from FIG. 1a, the gate-source threshold voltage is kept constant with respect to the source electrode S2b.

Further, if the voltage difference in FIG. 4, Vin1=Vin2, either of the diodes Di2a and Di2b is not forward-biased so that no parasitic influence is given by these diodes. Thus, Vgs2a=(Vin1−Vin2)=0 V or Vgs2b≧0 V holds. As a result, the good interrupted state can be obtained in the equivalent switch 2a or 2b.

In this case, there is no voltage difference between the voltage sources to be switched so that no voltage difference is generated between the source and back gate of the PMOS transistor 20a that is a model of the equivalent switch 2a. For this reason, the gate-source voltage threshold value thereof is equivalent to that when the electrodes of the source and back-gate of the PMOS transistor 20a are connected. Thus, the interrupted state in the equivalent switch 2a will not be impaired.

Next, an explanation will be given of the state of FIG. 5 which is a condition of the switching control input voltage Vinsel=logic H. Under this condition, both the P-channels of the equivalent switches 2a and 2b of the PMOS transistors, i.e. the paths between the source electrode S2a and drain electrode D2a and between the source electrode S2b and drain electrode D2b are conductive. On the other hand, both the P-channels of the equivalent switches 1a and 1b of the PMOS transistors, i.e. the paths between the source electrode S1a and drain electrode D1a and between the source electrode S1b and drain electrode D1b are interrupted.

Thus, conduction is given between the voltage source input terminal 2 and the output terminal 4 whereas interruption is given between the voltage source input terminal 1 and the output terminal 4. A voltage source voltage Vin2 connected to the input terminal 2 is selected so that the voltage source output voltage Vout at the voltage source output terminal 4=Vin2.

The gate-source voltages Vgs2a and Vgs2b of the equivalent switches 2a and 2b, assuming that their P-channel conduction resistance is negligible, become (−Vin2). If the voltage Vin2 is not smaller than the gate-source threshold voltage of each the equivalent switches 2a and 2b, as in the case when the above equivalent switches 1a and 1b are conducted, the voltage source switching path 62 falls in a good conductive state.

Since the voltage source voltage Vin2 passing through the equivalent switches 2a and 2b on the conduction side is applied to the gate electrode G1a of the equivalent switch 1a, as in the previous case, the gate-source voltage Vgs1a thereof, Vgs1a=(Vin2−Vin1). Further, when the diode Di1a is forward-biased, as in the previous case, the gate-source voltage Vgs1b of the equivalent switch 1b is estimated as Vgs1b≧0 V.

Attention is paid to the gate-source voltage of each the equivalent switches 1a and 1b. If the voltage difference between the voltage sources in FIG. 5 is Vin2>Vin1, the diode Di1b is forward-biased to pass, whereas the diode Di1a is reversed-biased and insulated to give no parasitic influence. In addition, the gate-source voltage Vgs1a≧0 V holds so that a good interrupted state is provided in the equivalent switch 1a as in the case when the equivalent switch 2a is interrupted.

On the other hand, if the voltage difference in FIG. 5 is Vin2<Vin1, the diode Di1a is forward-biased to pass, whereas the diode Di1b is reversed-biased and insulated to give no parasitic influence. In addition, when the diode Di1a is forward-biased, the gate-source voltage Vgs1b≧0 V holds so that the good interrupted state is provided in the equivalent switch 1b as in the case when the equivalent switch 2b is interrupted.

Further, if the voltage difference in FIG. 5, Vin2=Vin1, either of the diodes Di1a and Di1b is not forward-biased so that no parasitic influence is given by these diodes. Thus, Vgs1a=(Vin1−Vin2)=0 V or Vgs1b≧0 V holds. As a result, as in the case when the equivalent switch 2a or 2b is interrupted, the good interrupted state can be obtained in the equivalent switch 1a or 1b.

Figure 6:
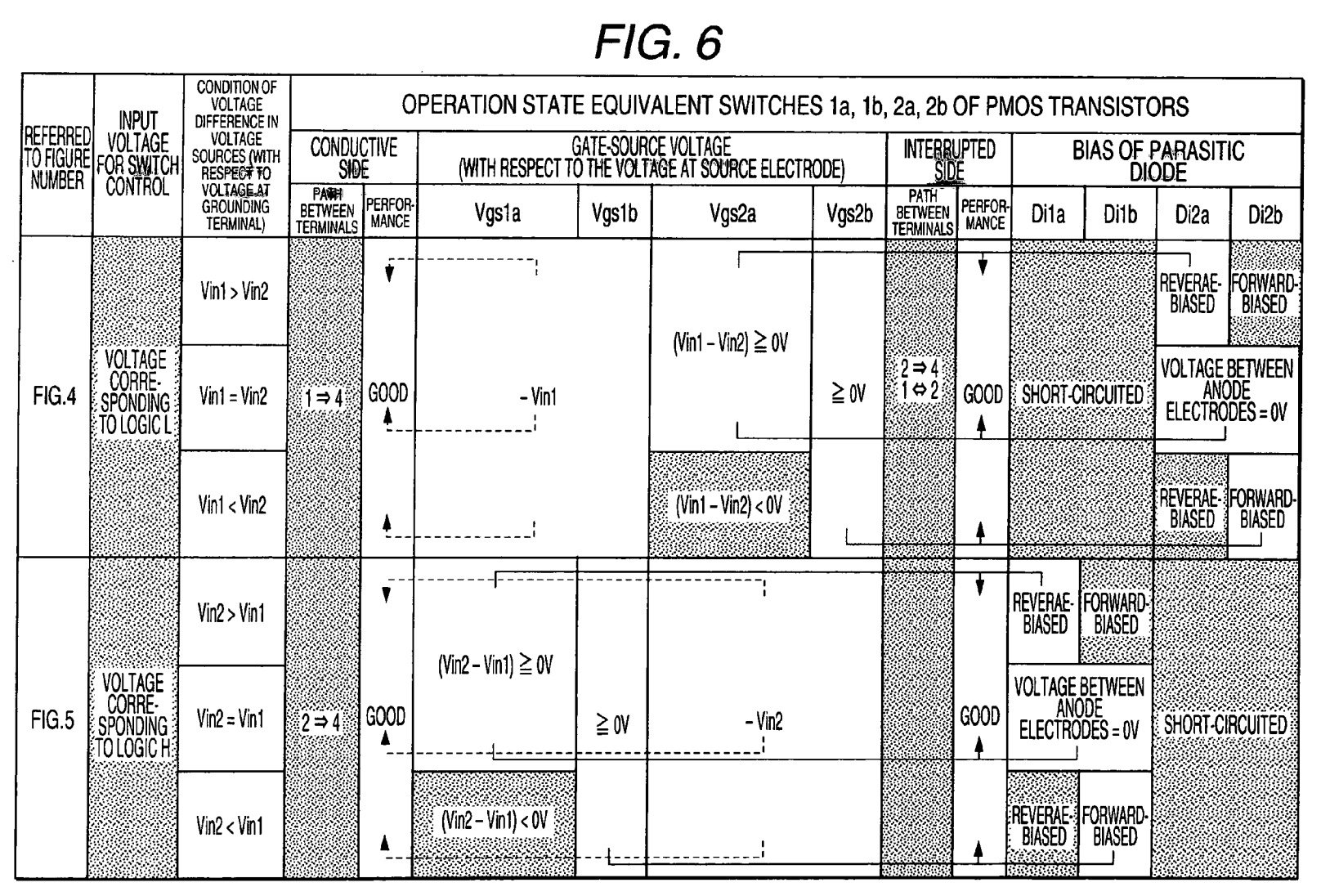

The summary of the above explanation is illustrated in FIG. 6. In FIG. 6, the above conducting performance can be obtained from the conditions of the items each starting from a dotted line arrow, whereas the above interrupting performance can be obtained from the conditions of the items each starting from a solid line arrow.

Accordingly, FIG. 1a shows an equivalent replacement of FIGS. 3, 4 and 5. In the voltage source switching device 6 according to Embodiment I shown in FIG. 1, therefore, if a positive voltage source not smaller than the gate-source threshold voltage of each of the PMOS transistors 10a, 10b, 20a, 20b is given to the voltage source input terminals 1 and 2, a voltage source switching device can be realized which regardless with the voltage difference therebetween, can switch-connect either of these voltages to a device to be supplied with the voltage source, connected to the voltage source output terminal 4.

Figure 7:
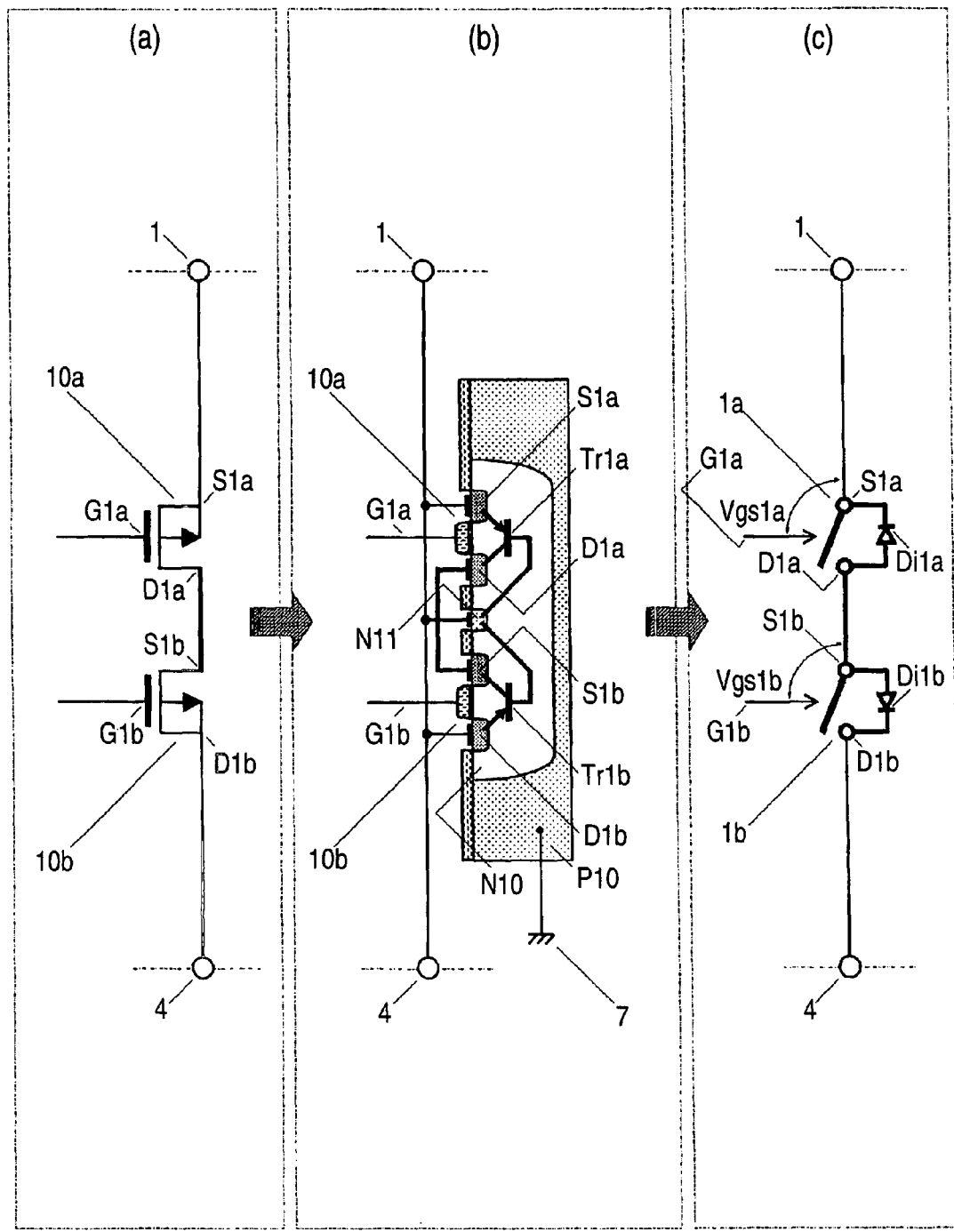
FIG. 7 is a view for explaining a different type of the series connection of PMOS transistors according to Embodiment I of this invention.

In this embodiment, as shown in FIG. 2(a) to FIG. 2(c), although a back gate electrode of each of the first PMOS transistor and the second PMOS transistor is connected to the direct connecting point between the source electrode of the second PMOS transistor and the drain electrode of the first PMOS transistor. However, as shown in FIG. 7(a) to 7(c), a back gate of the first PMOS transistor may be connected to a drain electrode of the PMOS transistor, a back gate of the second PMOS transistor may be connected to a source of the second PMOS transistor. According to this construction, since two parasitic diodes are configured so that the anode electrodes thereof are opposed to each other as shown in FIG. 7(c), it is possible to obtain same effects as the embodiment I.

Embodiment II

Figure 8:
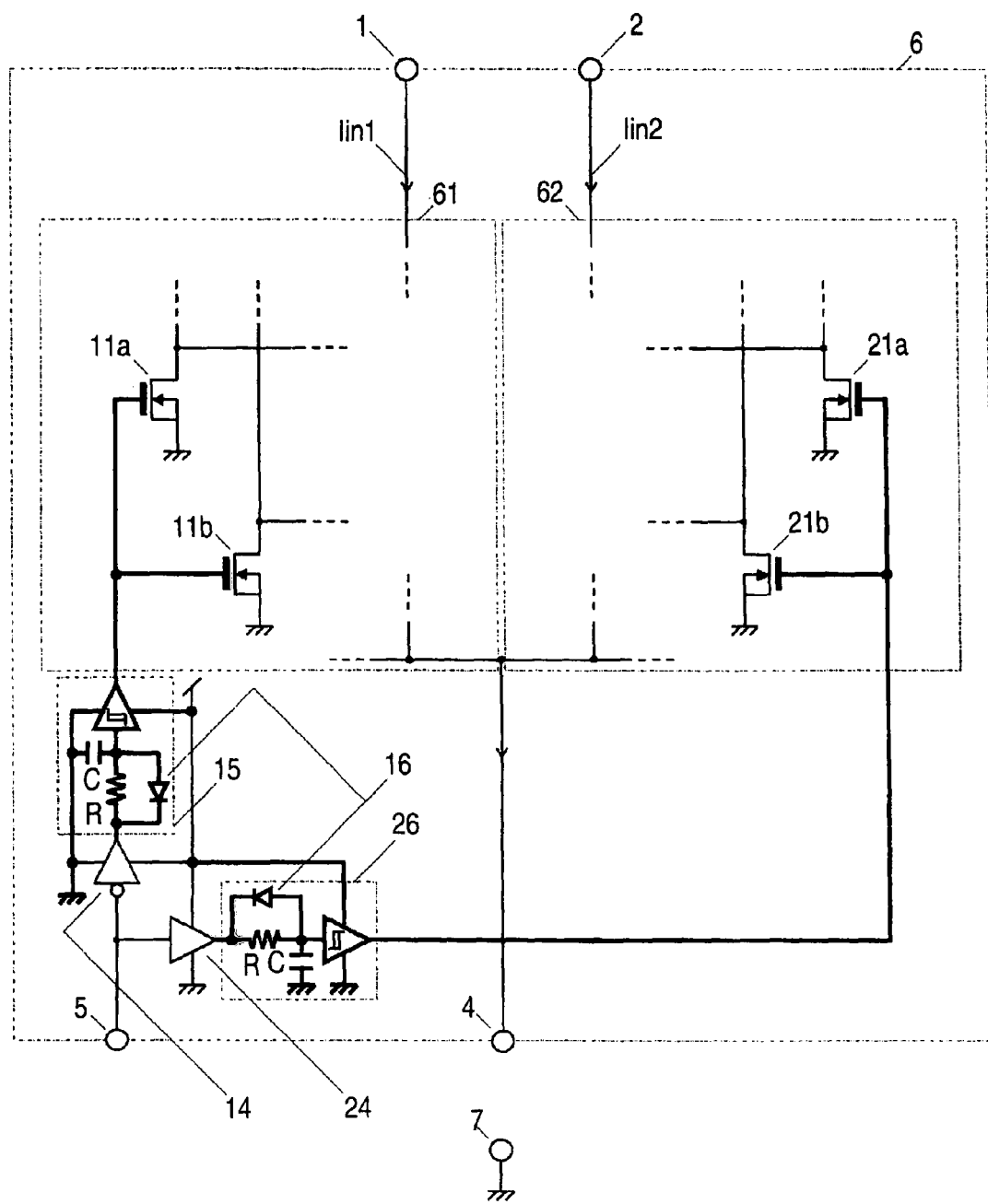
FIG. 8 is a view showing a voltage source switching device according to Embodiment II for giving a delay time when the voltage source is shifted from its interruption to its conduction.

FIG. 8 shows Embodiment II related to the above Embodiment I. In FIG. 8, immediately after the switching control logic inverter 14 and logic buffer 24 in FIG. 1a, logic input rising delay circuits 15 and 25 are inserted, each of which gives a rising delay only when the logic input is supplied to the logic inverter 14 and logic buffer 25, and delays the conducting timing of the voltage source for the interrupting timing thereof.

In order to solve the problem of Embodiment I shown in FIG. 1a, the above configuration intends to prevent occurrence of a moment when the PMOS transistors 10a, 10b, 20a, 20b are simultaneously and instantaneously conducted when the voltage source is switched from the voltage source input terminal 1 to 2, or from 2 to 1.

This inconvenience is attributable to the fact that the time taken for the PMOS transistor on the conducted side of the voltage source to shift from its saturated state filled with electrons in its P-channel to its interrupted state is generally longer than the time taken for the PMOS transistor on the interrupted side of the voltage source to shift from its interrupted state to its conducted state.

Figure 9:
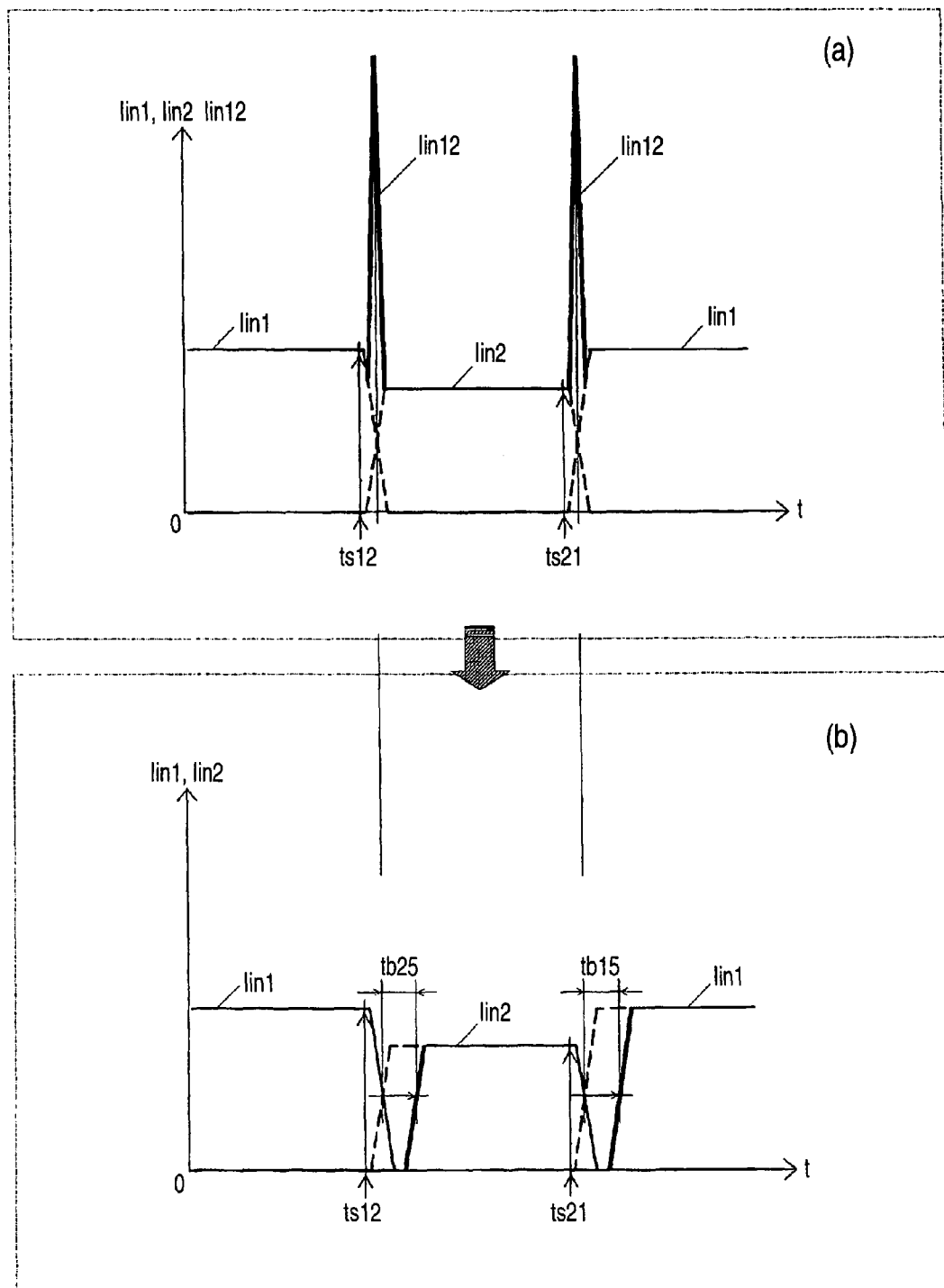
FIG. 9 is a view showing time passage in the current from a voltage source.

In this case, in addition to an input current Iin1 for the voltage source voltage Vin1 or an input current Iin2 for the voltage source voltage Vin2, which flows through the device 8 supplied with the voltage source in FIGS. 4 and 5, a passing-through current Iin12 as shown in FIG. 9(a) corresponding to the voltage difference (Vin1−Vin2) passing between the voltage sources 1 and 2 is generated.

The above passing-through current Iin12 is equal to the value obtained by dividing the absolute value |Vin1−Vin2| of the voltage difference between the voltage sources by the sum of the internal resistance of these voltage sources, conducting resistance of the PMOS transistor 10a, 10b, 20a, 20b, their connection wiring resistance. Generally, the sum of the internal resistance and conducting resistance is estimated at several Ω or so. Therefore, as the case may be, the peak value of the above passing-through current exceeds 1A.

The time while this current flows is instantaneous as short as μsec or so corresponding to the switching time of PMOS transistor. So, the limitation of its use is relaxed as compared with the current value permitted when a DC current flows. Therefore, by switching the voltage source, the voltage source and PMOS transistor will not be immediately broken.

However, for the following reasons, it is necessary to prevent occurrence of the passing-through current Iin12 in FIG. 9(a). First, where a lithium-ion secondary battery is used as an application example of the above voltage sources, if the passing-through current exceeds the threshold current value of an overcurrent preventing circuit incorporated to prevent ignition or explosion when a large current flows from the battery, this preventing circuit acts, thereby unexpectedly stopping the secondary battery. Secondly, owing to plural times of occurrence of the passing-through current Iin12 which is brought about by the voltage source switching device according to Embodiment I, deterioration of impairing the long term reliability will be generated in the above voltage sources and PMOS transistors.

In order to obviate such inconvenience, as seen from FIG. 8, the logic input rising delay circuits 15 and 25 are inserted in FIG. 1(a), thereby preventing the deterioration of impairing the unexpected stop or long term reliability. Thus, a voltage source switching device can be realized which as seen from FIG. 8(b), when the voltage source is switched from the input terminal 1 to the input terminal 2, or from 2 to 1, delays the switching of the PMOS transistor for the shift from the interrupted state to the conducted state of the voltage source, avoids the instantaneous connection with the transistor from the conducted state to the interrupted state and prevents occurrence of the passing-through current Iin12.

Embodiment III

Figure 10:
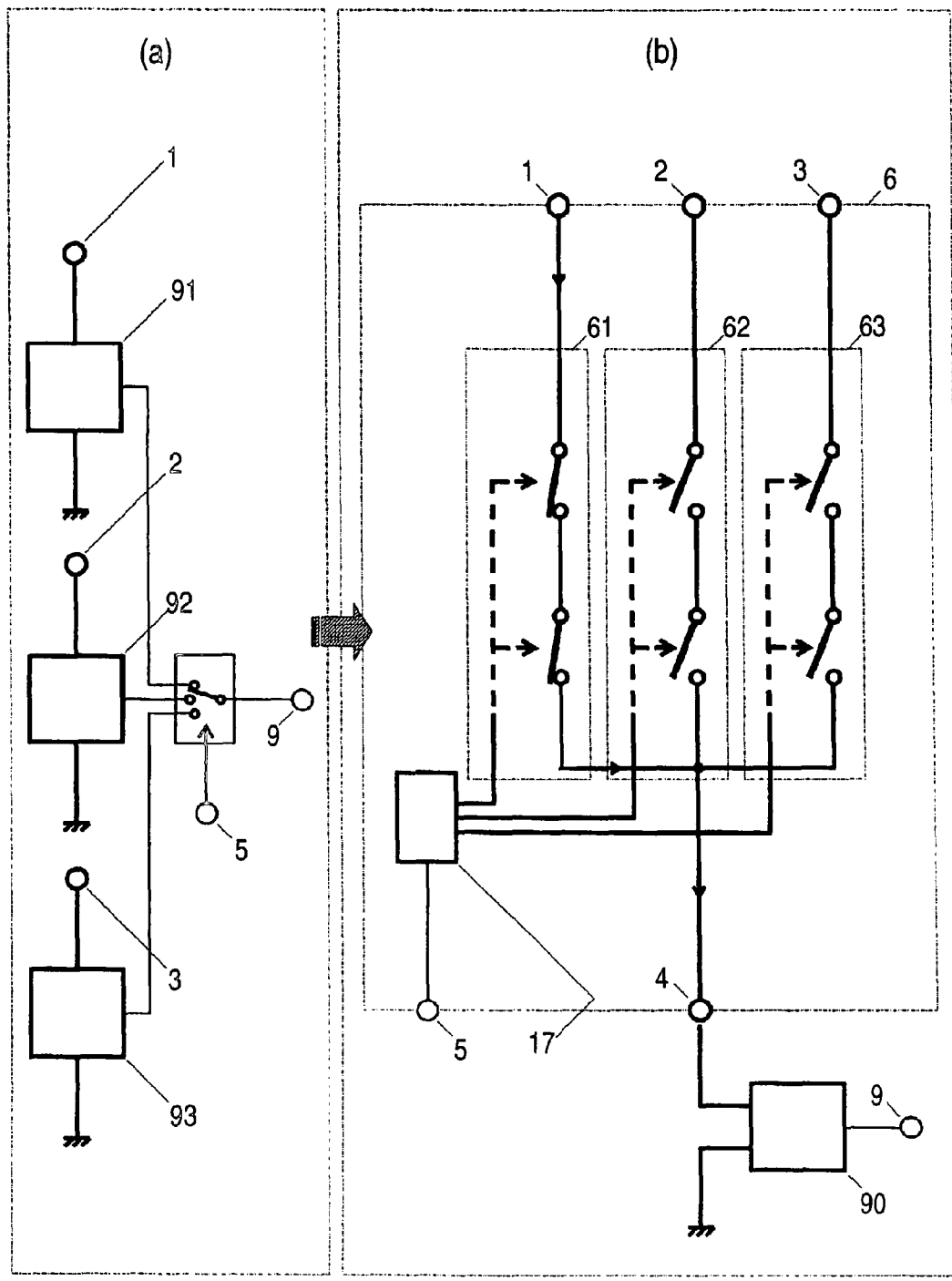
FIG. 10 is a view for explaining a voltage source switching device according to Embodiment III of this invention.

Embodiment III which is an application of Embodiments I and II is shown in FIG. 10(b). FIG. 10(a) shows a conventional example corresponding to FIG. 10(b). In FIG. 10(a), one of signal input/output processing devices 91, 92, 93 requiring different voltage source voltages is exclusively switch-connected to a signal input/output terminal 9 common to them by a switching control input terminal 5.

The above processing devices 91, 92, 93, which generally have different voltage amplitude specifications for the signal input/output terminal 9, required different voltage source input terminals 1, 2, 3. Therefore, even if a part of the processing devices are unified as long as the voltage source voltages are common, since these voltage source voltages are different, the processing devices 91, 92, 93 must be given an overlapped function, respectively. As a result, as the case may be, the entire mounting apparatus shown in FIG. 10(a) was upsized.

In FIG. 10(b), between the voltage source input terminals 1, 2, 3 and the signal input/output terminal 9 of a processing device 90 in which the functions of the processing devices 91, 92, 93 are unified, the voltage source switching device 6 according to this embodiment is connected. Thus, in place of the case where one of the processing devices 91, 92, 93 is switch-connected to the signal input/output terminal 9 by the switch-controlling input terminal 5 according their individual use, one of the voltage source input terminals 1, 2, 3 is switch-connected by the input terminal 5, thereby reducing the scale of the entire mounting device shown in FIG. 10(a).

In this case, a voltage source input terminal 3 is added to Embodiment I. However, the voltage source in a conductive state is limited to either one of the input terminals 1, 2, 3. For this reason, in FIG. 6, if the voltage source Vin2 is read as the voltage at the input terminal 3, and the voltage source voltage Vin1 is read as the voltage at either the input terminal 1 or 2, as in Embodiment I, in this embodiment also, a voltage source switching device can be realized in which one of the voltage sources is supplied to the power-supplied device regardless of the voltage difference among these voltage sources.

Embodiment IV

Figure 11:
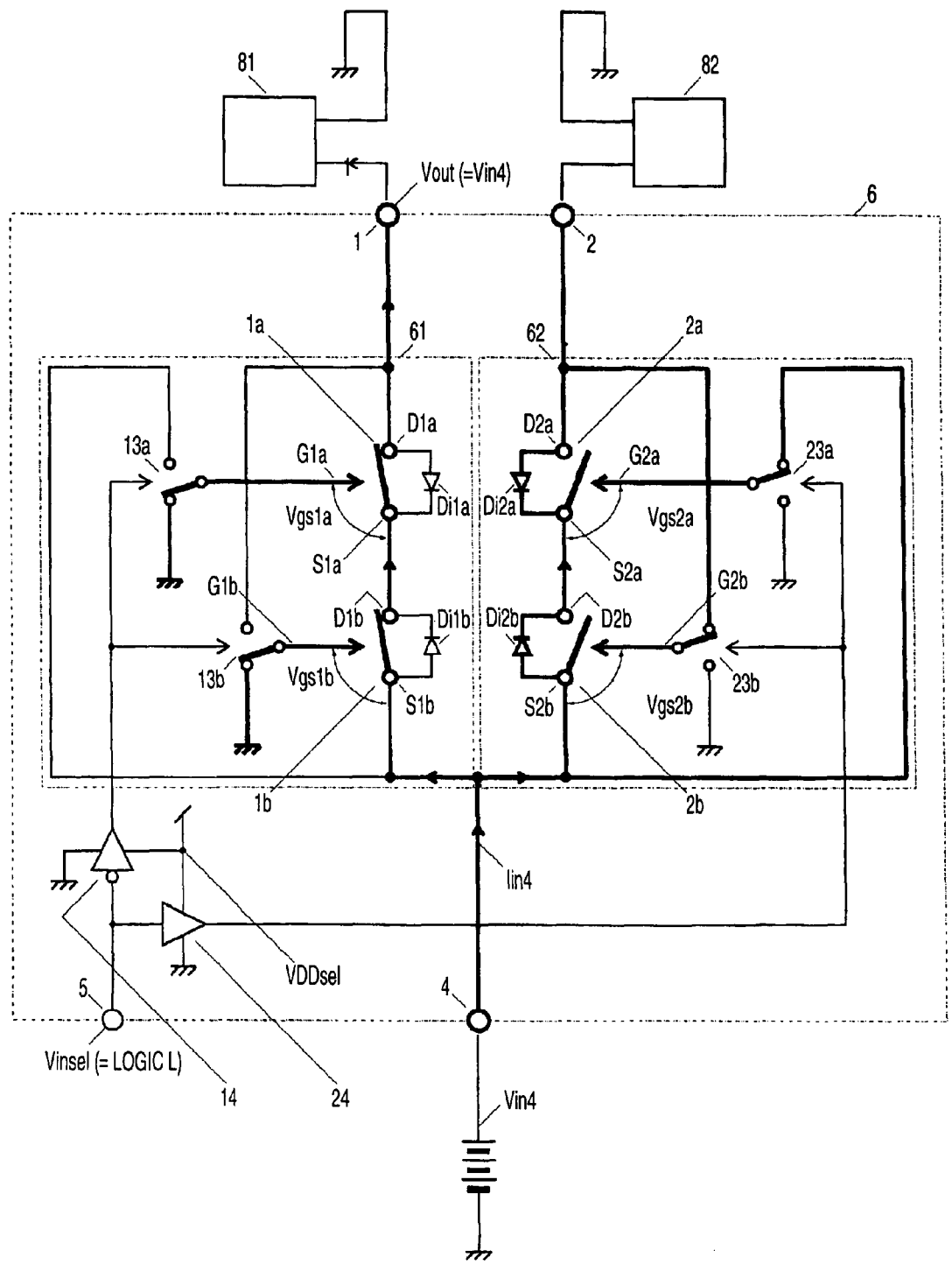
FIG. 11 is a view showing a voltage source switching device according to the fourth embodiment in which voltage sources and the supplied device therefor in FIG. 4 are replaced by each other.
Figure 12:
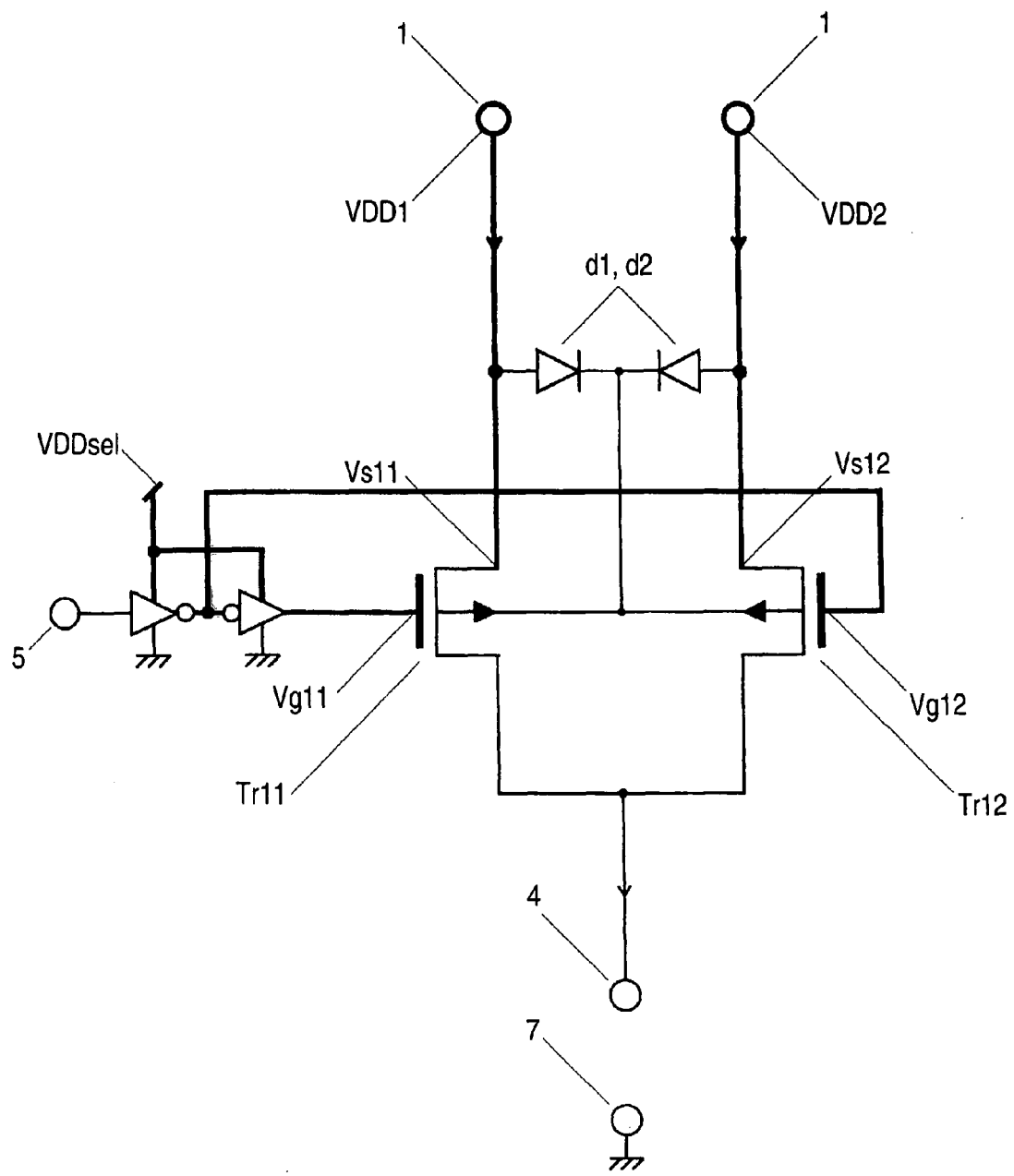
FIG. 12 is a schematic view of a conventional supplied voltage switching circuit.
Figure 13:
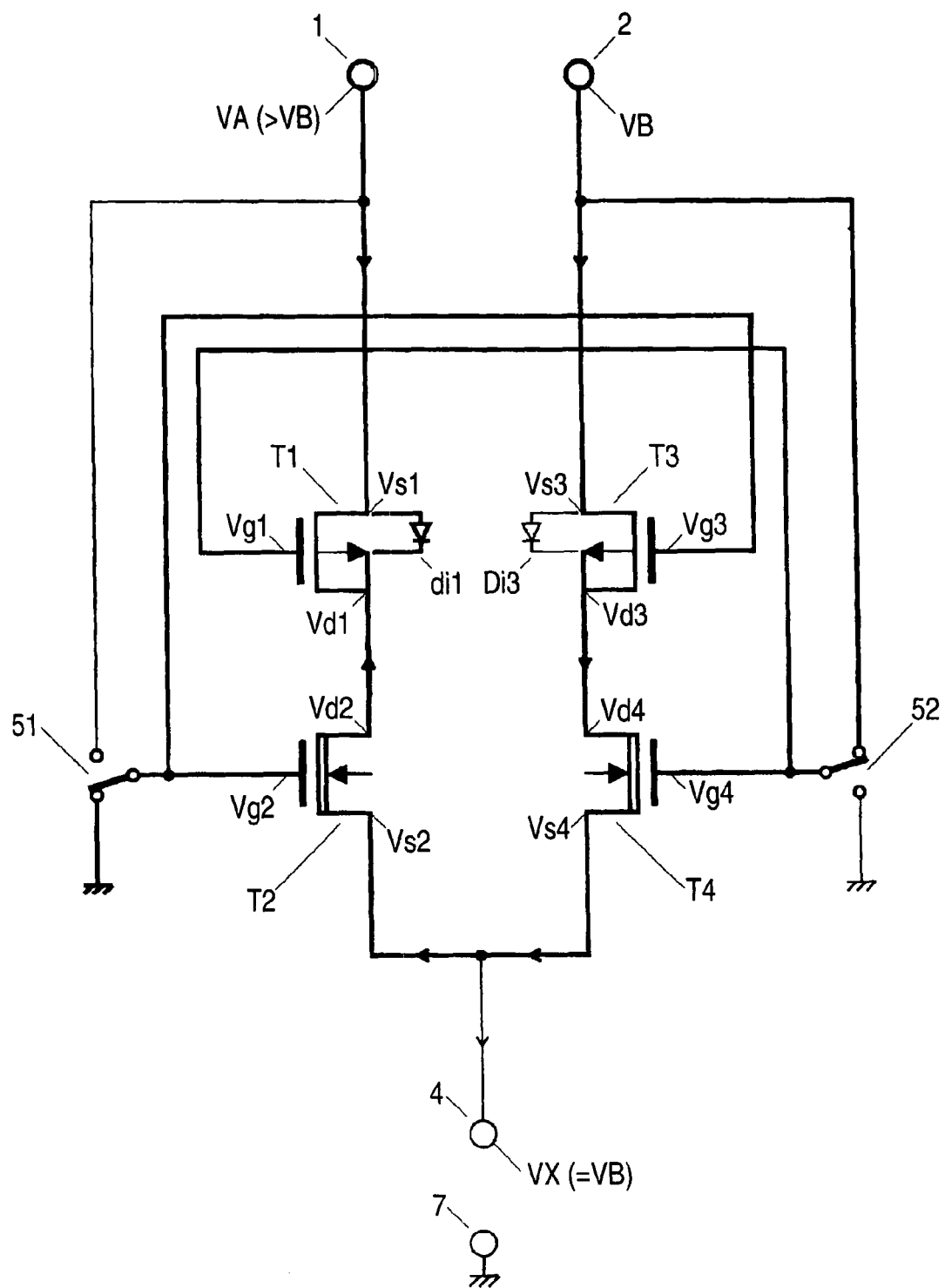
FIG. 13 is a schematic view of a conventional power source switching circuit for a semiconductor device.

FIG. 11 shows an embodiment in which the power-supplied device 8 for voltage sources and the voltage sources at the voltage source input terminals 1 and 2 in FIG. 4 are replaced by each other. In FIG. 11, one voltage source is switch-connected to one of two power-supplied devices 81 and 82 therefor.

In FIG. 11, in opposition to the case of FIG. 4, the P-channel electrodes of the PMOS transistors 10a, 10b, 20a, 20b are referred to as the source electrode and the drain electrode in order in the direction from the voltage source output terminal 4 to the voltage source terminal 1 or 2.

The respective gate-source voltages Vgs1a and Vgs1b of the equivalent switches 1a and 1b, assuming that their P-channel conducting resistance is negligible, are (−Vin4). If the voltage Vin4 is not smaller than the gate-source threshold voltage of each of the equivalent switches 1a and 1b, a good conductive state can be obtained in the voltage source switching path 61.

Now, since there is only a single voltage source, the voltage at the input terminal 1 or 2 is not larger than the voltage Vin4 of the single voltage source. In this case, in the equivalent switch 2a for the PMOS transistor on the interrupted side of the voltage source, its parasitic diode Di2a is reversed biased so that the gate-source voltage Vgs $2a \geqq 0$ V. Thus, by the equivalent switch 2a, the good interrupted state can be obtained in the voltage source switching path 62.

It is assumed that in addition to the paths from the output terminal 4 to the input terminal 1 and from the output terminal 4 to the input terminal 2, a new voltage source switching path from the output terminal 4 to a new input terminal is prepared. Also in the case where this further path is interrupted, by a new PMOS transistor corresponding to the equivalent switch 2a on this new path, like the above case, the good interrupted state can be obtained in the new switching path.

Further, in FIG. 11, switching control can be done so that both switching paths 61 and 62 are made conductive and both the power-supplied circuits 81 and 82 are connected to the voltage source.

This invention provides the effect that the voltage source can be switch-controlled regardless of voltage changes in the voltage sources to be switched and employed for switch control and is useful to the switching device for selectively switching the connection of the voltage source and the power-supplied device.

What is claimed is:

1. A switching device for selectively switching the connection between any one of a plurality of voltage sources and a power-supplied device, each of switching paths for connecting each of the plurality of voltage sources and the power-supplied device comprising:
    an input terminal, to be connected to any one of the voltage sources;
    a common output terminal, to be connected to the power-supplied device; and
    a first and a second enhancement type P-channel MOS transistor, the drain electrode of the first enhancement type P-channel MOS transistor and the source electrode of the second enhancement type P-channel MOS transistor being connected to each other;
    wherein the gate electrode of the first enhancement type P-channel MOS transistor is connected to the output terminal;
    the gate electrode of the second enhancement type P-channel MOS transistor is connected to the input terminal;
    the first enhancement type P-channel MOS transistor and the second enhancement type P-channel MOS transistor are connected in series;
    the output terminal is connected to the gate electrode of the first enhancement type P-channel MOS transistor via a first resistor; and
    the input terminal is connected to the gate electrode of the second enhancement type P-channel MOS transistor via s second resistor.

2. A switching device for selectively switching the connection between any one of a plurality of voltage sources and a power-supplied device, each of switching paths for connecting each of the plurality of voltage sources and the power-supplied device comprising:
    an input terminal, to be connected to any one of the voltage sources;
    a common output terminal, to be connected to the power-supplied device; and
    a first and a second enhancement type P-channel MOS transistor, the drain electrode of the first enhancement type P-channel MOS transistor and the source electrode of the second enhancement type P-channel MOS transistor being connected to each other;

wherein the gate electrode of the first enhancement type P-channel MOS transistor is connected to the output terminal;

the gate electrode of the second enhancement type P-channel MOS transistor is connected to the input terminal;

the first enhancement type P-channel MOS transistor and the second enhancement type P-channel MOS transistor are connected in series;

the output terminal is connected to the gate electrode of the first enhancement type P-channel MOS transistor via a first level shift circuit; and the input terminals is connected to the gate electrode of the second enhancement type P-channel MOS transistor via a second level shift circuit.

3. The switching device according to claim 1, wherein:

a switching control input terminal is connected to the gate electrode of the first enhancement type P-channel MOS transistor and the gate electrode of the second enhancement type P-channel MOS transistor respectively via a first N MOS transistor and a second N MOS transistor.

4. The switching device according to claim 1, wherein:

a back gate electrode of the first enhancement type P-channel MOS transistor and the source electrode thereof are connected; and a back gate electrode of the second enhancement type P-channel MOS transistor and the drain electrode thereof are connected.

5. The switching device according to claim 1, wherein:

a back gate electrode of the first enhancement type P-channel MOS transistor and the drain electrode thereof are connected; and a back gate electrode of the second enhancement type P-channel MOS transistor and the source electrode thereof are connected.

6. The switching device according to claim 1, wherein:

in case of exchanging the connection switching between the plurality of voltage sources and the input terminal, a delay time is provided in a logic input rising.

7. A switching device for selectively switching the connection between any one of a plurality of voltage sources and a power-supplied device, each of switching paths for connecting each of the plurality of voltage sources and the power-supplied device comprising:

an input terminal, to be connected to any one of the voltage sources;

a common output terminal, to be connected to the power-supplied device; and a first and a second enhancement type P-channel MOS transistor, the source electrode of the first enhancement type P-channel MOS transistor and the drain electrode of the second enhancement type P-channel MOS transistor being connected to each other;

wherein the gate electrode of the first enhancement type P-channel MOS transistor is connected to the output terminal;

the gate electrode of the second enhancement type P-channel MOS transistor is connected to the input terminal;

the output terminal is connected to the gate electrode of the first enhancement type P-channel MOS transistor via a first resistor; and the input terminal is connected to the gate electrode of the second enhancement type P-channel MOS transistor via s second resistor.

8. A switching device for selectively switching the connection between any one of a plurality of voltage sources and a power-supplied device, each of switching paths for connecting each of the plurality of voltage sources and the power-supplied device comprising:

an input terminal, to be connected to any one of the voltage sources;

a common output terminal, to be connected to the power-supplied device; and a first and a second enhancement type P-channel MOS transistor, the source electrode of the first enhancement type P-channel MOS transistor and the drain electrode of the second enhancement type P-channel MOS transistor being connected to each other;

wherein the gate electrode of the first enhancement type P-channel MOS transistor is connected to the output terminal;

the gate electrode of the second enhancement type P-channel MOS transistor is connected to the input terminal;

the output terminal is connected to the gate electrode of the first enhancement type P-channel MOS transistor via a first level shift circuit; and the input terminals is connected to the gate electrode of the second enhancement type P-channel MOS transistor via a second level shift circuit.

9. The switching device according to claim 7, wherein:

a switching control input terminal is connected to the gate electrode of the first enhancement type P-channel MOS transistor and the gate electrode of the first enhancement type P-channel MOS transistor respectively via a first N MOS transistor and a second N MOS transistor.

10. The switching device according to claim 7, wherein:

a back gate electrode of the first enhancement type P-channel MOS transistor and the source electrode thereof are connected; and a back gate electrode of the second enhancement type P-channel MOS transistor and the drain electrode thereof are connected.

11. The switching device according to claim 7, wherein:

a back gate electrode of the first enhancement type P-channel MOS transistor and the drain electrode thereof are connected; and a back gate electrode of the second enhancement type P-channel MOS transistor and the source electrode thereof are connected.

12. The switching device according to claim 7, wherein:

in case of exchanging the connection switching between the plurality of voltage sources and the input terminal, a delay time is provided in a logic input rising.

13. The switching device according to claim 2, wherein:

a back gate electrode of the first enhancement type P-channel MOS transistor and the source electrode thereof are connected; and a back gate electrode of the second enhancement type P-channel MOS transistor and the drain electrode thereof are connected.

14. The switching device according to claim 2, wherein:

a back gate electrode of the first enhancement type P-channel MOS transistor and the drain electrode thereof are connected; and a back gate electrode of the second enhancement type P-channel MOS transistor and the source electrode thereof are connected.

15. The switching device according to claim 2, wherein:

in case of exchanging the connection switching between the plurality of voltage sources and the input terminal, a delay time is provided in a logic input rising.

16. The switching device according to claim 8, wherein:

a back gate electrode of the first enhancement type P-channel MOS transistor and the source electrode thereof are connected; and a back gate electrode of the second enhancement type P-channel MOS transistor and the drain electrode thereof are connected.

17. The switching device according to claim 8, wherein:

a back gate electrode of the first enhancement type P-channel MOS transistor and the drain electrode thereof are connected; and a back gate electrode of the second enhancement type P-channel MOS transistor and the source electrode thereof are connected.

18. The switching device according to claim 8, wherein:

in case of exchanging the connection switching between the plurality of voltage sources and the input terminal, a delay time is provided in a logic input rising.

* * * * *